United States Patent [19]

Frederick

[11] Patent Number: 4,516,225
[45] Date of Patent: May 7, 1985

[54] MOS DEPLETION LOAD CIRCUIT

[75] Inventor: Bruce A. Frederick, San Jose, Calif.

[73] Assignee: Advanced Micro Devices, Inc., Sunnyvale, Calif.

[21] Appl. No.: 467,676

[22] Filed: Feb. 18, 1983

[51] Int. Cl.³ .................. H03K 17/687; G11C 7/00
[52] U.S. Cl. ........................ 365/203; 307/296 R; 307/304; 307/574
[58] Field of Search .......... 307/443, 450, 574, 581, 307/296 R, 448, 297, 304, 475, 264; 365/203, 174, 182, 189

[56] References Cited

U.S. PATENT DOCUMENTS

| | | | |
|---|---|---|---|
| 3,950,654 | 4/1976 | Broedner et al. | 307/297 X |
| 4,048,524 | 9/1977 | Laugesen et al. | 307/279 X |
| 4,199,693 | 4/1980 | Bennett | 307/297 X |
| 4,239,980 | 12/1980 | Takanashi et al. | 307/574 X |
| 4,250,408 | 2/1981 | Spence | 307/297 X |
| 4,321,489 | 3/1982 | Higuchi et al. | 307/450 X |

Primary Examiner—Stanley D. Miller
Assistant Examiner—D. R. Hudspeth
Attorney, Agent, or Firm—Patrick T. King; J. Vincent Tortolano

[57] ABSTRACT

A depletion load element for connection between a supply line $V_{CC}$ and a node 10 includes an enhancement mode field effect transistor 12 having a source 14 connected to the node 10, a gate 15 connected to the supply line, and a drain 25 connected to a second node; and a depletion mode field effect transistor 20 having a drain 21 connected to the supply line $V_{CC}$ and having a source 23 connected to the second node. The gate 22 is connected to one of the first or second nodes.

3 Claims, 6 Drawing Figures

MOS DEPLETION LOAD CIRCUIT

BACKGROUND OF THE INVENTION

1. Field of the Invention

This invention relates to electronic circuits, and in particular to a field effect transistor circuit used as a load circuit, for example, in inverters, logic gates, and static metal oxide semiconductor random access memories.

2. Description of the Prior Art

In many semiconductor applications requiring load elements, for example, inverters, logic gates and static memory systems, a termination circuit includes a single depletion mode field effect transistor (FET) having a drain connected to a voltage supply bus, and having gate and source connected together and to a node to be pulled-up. A depletion mode FET connected in this manner is always conducting, but current limiting. Depletion mode FET's are superior load elements when compared to enhancement mode FET's and resistors, because of the constant current source characteristics of the depletion mode. A pure depletion load provides more charging current for the same short circuit current. This allows faster operation at the same power levels.

Quite often, however, the voltage to which a node is to be pulled is an intermediate high voltage, for example, one enhancement threshold voltage below the high voltage. As a result an enhancement mode FET is often placed between the high pull-up voltage and the depletion mode FET. The gate of the enhancement mode FET is tied to the high pull-up voltage and the gate of the depletion mode FET is tied to its source which is the node to be pulled-up. The drain of the depletion mode FET is connected to the source of the enhancement mode FET. Such a circuit configuration offers an intermediate high potential and behaves as a constant current source load. Unfortunately, because some of the voltage drop occurs across the enhancement mode FET, a pure depletion load line characteristic is not achievable unless the enhancement mode transistor is infinitely larger than the depletion mode transistor. Because this solution is impractical, such a circuit configuration typically has a load line characteristic somewhere between enhancement and depletion type transistors. A circuit of this type is described in more detail in U.S. Pat. No. 4,195,356 entitled "Sense Line Termination Circuit for Semiconductor Memory Systems."

SUMMARY OF THE INVENTION

This invention provides a circuit including depletion and enhancement mode FET's which provides more of a depletion load line characteristic than circuits of the prior art. The invention provides improved operating characteristics for inverters, logic gates, and memories using the circuit. In one embodiment a load device for connection between a supply line and a first node comprises an enhancement mode FET having a source connected to the first node, a gate connected to the supply line, and a drain connected to a second node, and a depletion mode FET having a drain connected to the supply line and having a source connected to the second node. The gate of the depletion FET is connected to one of the first node or second node.

This circuit configuration reduces the enhancement characteristics of the circuit because the enhancement device is maintained in the linear region with a large over-drive, and thus the drain-source voltage of the enhancement device is smaller than in prior art circuits. The resultant load characteristics are therefore more depletion type than prior art.

DETAILED DESCRIPTION OF THE PREFERRED EMBODIMENT

Figure 1:
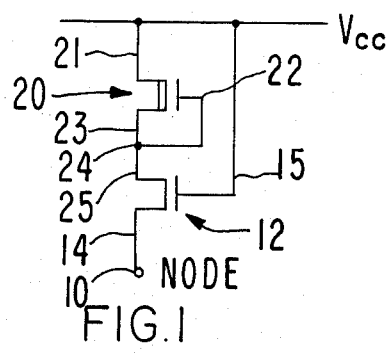
FIG. 1 is an electrical schematic of one embodiment of the invention.

FIG. 1 is an electrical schematic of the preferred embodiment of the depletion load circuit of this invention. As shown, the circuit is connected between a power supply line $V_{CC}$ and a node 10. The circuit includes an enhancement mode field effect transistor 12 having a source 14 connected to node 10, a drain connected to node 24, and a gate 15 connected to the supply line. A depletion mode field effect transistor 20 has its drain 21 connected to the supply line and its gate 22 and source 23 connected to the drain 25 of the enhancement mode transistor 12.

As is well-known for n-MOS devices, the positive potential on drain 25 attracts electrons from source 14, but flow of these electrons is blocked by holes in the P conductivity type channel. A positive charge on gate 15 attracts the electrons in the channel to permit current flow between the source and drain. The n-MOS depletion mode device 20 functions in an opposite manner, being normally conducting unless a negative voltage on the gate expels electrons from the channel and turns the device off. The operation of the circuit shown in FIG. 1 will be described below, in comparison to that of the prior art.

Figure 2:
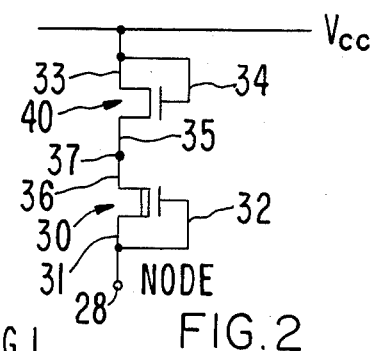
FIG. 2 is an electrical schematic of a prior art circuit.

FIG. 2 is an electrical schematic of the prior art load circuit of U.S. Pat. No. 4,195,356. As shown in FIG. 2 the circuit includes a depletion mode FET 30 and an enhancement mode FET 40. The source 31 and gate 32 of the depletion mode FET are connected to node 28, while the drain 33 and gate 34 of the enhancement mode FET 40 are connected together and to the supply line $V_{CC}$. The source 35 of the enhancement mode device is connected to the drain 36 of the depletion mode device.

The circuit of FIG. 2 illustrates the now well-known technique of pulling node 28 to an intermediate high voltage about one threshold voltage below the $V_{CC}$ supply. This is achieved by placing the enhancement transistor 40 between the high pull-up voltage and the depletion transistor 30. The resulting configuration provides an intermediate high voltage and a substantially constant current source load, but not all of the voltage drop occurs across the depletion device 30 as desired. As will be shown below, to achieve such a result the ratio of W/L (gate width to gate length) of the enhancement transistor must be infinitely larger than the same ratio for the depletion transistor. Because this solution is obviously impractical the circuit configuration shown in FIG. 2 will have a load line characteristic somewhere between that of the enhancement mode device 40 and depletion mode device 30.

For the same size transistors the circuit shown in FIG. 1 will have more of a depletion load line characteristic than that shown in FIG. 2. This is because more of the voltage drop occurs across the depletion mode device 20, and less across the enhancement mode device 12. The reason for the different load line characteristics between the circuit shown in FIG. 1 and that shown in FIG. 2, when the node is at a voltage sufficient to cause conduction of current from $V_{CC}$ to the node, is as follows: Under these conditions the enhancement device in FIG. 2 is on, and therefore its gate to source and drain to source to potentials are greater than the effective threshold voltage. As the node voltage is reduced the current through the configuration increases and the gate-source and drain-source potentials of the enhancement transistor also increase, giving it the characteristics of a saturated enhancement load. To minimize the enhancement characteristics of the overall circuit, the W/L ratio of the enhancement transistor must be increased.

Figure 3:
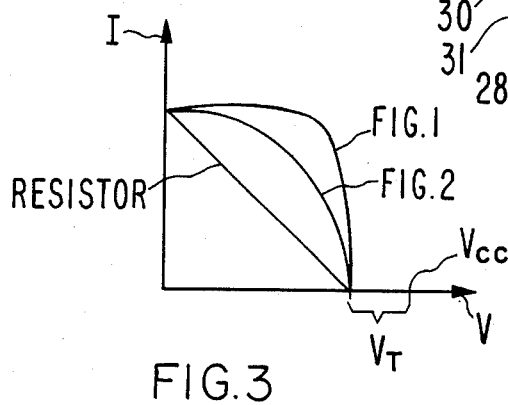
FIG. 3 is a graph comparing the load line of the preferred embodiment with that of the prior art.

Under the same conditions as described for FIG. 2, the circuit of FIG. 1 reduces the enhancement characteristics because the enhancement device is always operated in a linear region with a larger overdrive value (gate-source potential less threshold voltage). This condition allows the drain-source potential of the enhancement device to be much smaller than for the circuit depicted in FIG. 2. As a result the load line characteristics of the circuit shown in FIG. 1 are more of a depletion type device than that shown in FIG. 2. FIG. 3 illustrates the load lines of the two circuits shown in FIGS. 1 and 2.

For the circuit shown in FIG. 2, neglecting second order effects, and assuming that the supply voltage $V_{CC}$ is sufficiently large to turn on the enhancement FET, the drain to source current of the enhancement and depletion mode devices is given by the following:

$$I_{DSE} = \frac{W_E}{L_E} K_E'(V_{GS} - V_{TE})^2$$

$$I_{DSD} = \frac{W_D}{L_D} K_D'(-V_{TD})^2$$

where W is the width of the gate, L is the length of the gate (the distance between the source and drain), and K is a conduction factor depending upon the materials used. Solving for the voltage $V_X$ at node 37:

$$V_X = V_{CC} - V_{TE} - |V_{TD}| \sqrt{\frac{W_D/L_D}{W_E/L_E} \frac{K_D'}{K_E'}}$$

This equation shows the relationship of the voltage at node 37 to the W/L ratio of the enhancement and depletion FET's. The voltage $V_X$ is proportional to the $W_E/L_E$ ratio and inversely proportional to the $W_D/L_D$ ratio.

For the circuit shown in FIG. 1, also neglecting second order effects, the drain to source current for each of the enhancement and depletion mode devices is given by:

$$I_{DSD} = \frac{W_D}{L_D} K_D'(-V_{TD})^2$$

$$I_{DSE} = \frac{W_E}{L_E} K_E'\left(V_{GS} - V_T - \frac{V_{DS}}{2}\right) V_{DS}$$

using the same symbols as defined above. Solving for the intermediate voltage $V_X$ at node 24:

$$V_X = \frac{-2(V_{TE} - V_{CC}) \pm \sqrt{[2(V_{TE} - V_{CC})]^2 - 8V_{TD}^2 \frac{W_D/L_d}{W_E/L_E} \frac{K_D'}{K_E'}}}{2}$$

The foregoing equation shows a similar relationship between the intermediate voltage at node 24 and the W/L ratios of the field effect transistors. To compare the intermediate voltages at nodes 24 and 37 for each of the configurations shown in FIGS. 1 and 2, assume that both enhancement W/L ratios are the same, and both depletion W/L ratios are the same. Also assuming:

$$\frac{W_D/L_D}{W_E/L_E} = 0.1$$

$$K_D'/K_E' = 1$$
$$V_{TD} = -3$$
$$V_{TE} = +1$$
$$V_{CC} = +5$$

the voltage at node 24 will be:

$$V_{X24} = 0.23 \text{ volts}$$

and the voltage at node 37 will be:

$$V_{X37} = 3.05 \text{ volts}$$

Knowing the intermediate node voltages for the circuit configurations shown in both FIGS. 1 and 2, a qualitative comparison between the circuits may be made. For the circuit shown in FIG. 2 the voltage drop across the depletion FET will be 3.05 volts, while for the circuit shown in FIG. 1 the voltage drop across the depletion FET will be 4.77 volts. Similarly, the drop across the enhancement device in FIG. 2 is 1.95 volts, while the drop across the enhancement device in FIG. 1 is 0.23 volts. Therefore, the circuit in FIG. 2 will have an I/V characteristic which is 61% (=3.05/5×100) of a pure depletion load, whereas for the configuration shown in FIG. 1 the I/V characteristic will be 95% (=4.77/5×100) of a pure depletion load. Therefore, the circuit of this invention represents a 50% improvement in depletion load characteristic over that of the prior art. As a result, for the same short circuit current ($I_{DS}$) a 50% improvement in charging circuit can be realized.

Figure 4:
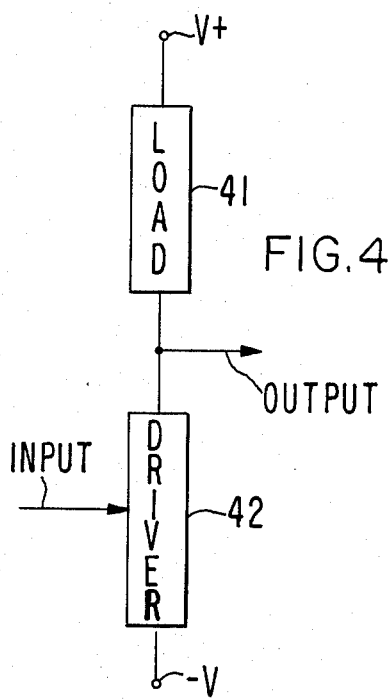
FIG. 4 is a block diagram illustrating a general application for the circuit of this invention.

FIG. 4 illustrates a generalized application for the load circuit of this invention. As shown in FIG. 4, a load circuit 41, such as depicted in FIG. 1, is connected between a higher potential +V and a lower potential −V. The lower potential is not necessarily negative, but simply lower than the positive potential. A driver 42 is connected between the load and the lower potential −V, and receives an input signal as shown. Driver 42 may comprise a single transistor. The output is taken from between load 41 and driver 42, and will be the inverse of the input signal. As apparent from FIG. 4, the load circuit of this invention 41 has numerous applications, including inverters, logic gates, and memories. In general, the circuit will be suitable for any application in which a load circuit having a depletion characteristic and an intermediate voltage is sought.

Figure 5:
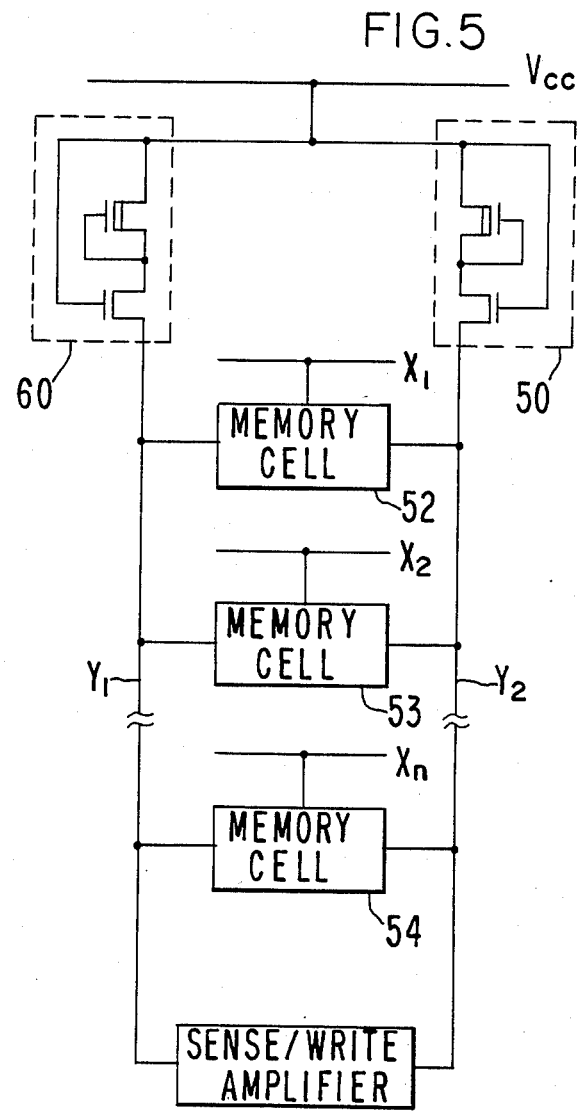
FIG. 5 is an electrical schematic showing application of the circuit of this invention to a static MOS semiconductor memory.

FIG. 5 illustrates a specific application for the depletion load circuit of this invention. As shown in FIG. 5 depletion load circuits 50 and 60 are interconnected between a supply bus of high pull-up voltage $V_{CC}$ and sense lines $Y_1$ and $Y_2$ for a plurality of static memory cells 52, 53 and 54. The termination circuits 50 and 60 function to pull the sense line toward a predetermined intermediate voltage value about one threshold voltage below $V_{CC}$ whenever none of the memory cells have low voltage memory nodes coupled to the sense lines $Y_1$ and $Y_2$. Each memory cell is connected between lines $Y_1$ and $Y_2$, and to a select line X. The sense line termination circuits 50 and 60 limit the voltage excursion of the sense lines and permit the sense lines to be pulled down with predetermined current limitations to a given low voltage value when the sense line is coupled to a low voltage memory node. The result is that the circuit of this invention provides more of a depletion load line characteristic than prior art circuits. This allows superior performance when compared to enhancement mode FET's and resistors, and prior art circuits.

Figure 6:
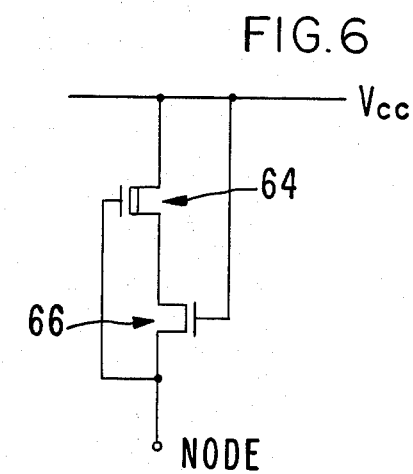
FIG. 6 is an electrical schematic of an alternate embodiment of the invention.

FIG. 6 illustrates an alternate embodiment of the invention in which the gate of the depletion device 64 is coupled to the node or source of the enhancement device, rather than to the drain of the enhancement device. The circuit depicted in FIG. 6 functions in the same manner as described in conjunction with FIG. 1, but will not charge as quickly in view of the lower gate potential of the depletion device.

Although a preferred embodiments of the invention have been described above, it should be understood that these embodiments are intended to illustrate and explain the invention. The scope of the invention may be ascertained from the following claims.

I claim:

1. A memory circuit comprising:
memory means for storing data;
data input/output means coupled to said memory means by two sense lines for supplying data to and for receiving data from said memory means; and
load means coupled between a voltage source and said sense lines for charging said sense lines to a predetermined voltage, said load means including first enhancement and depletion mode field effect transistors coupled between one of said sense lines and said voltage source and second enhancement and depletion mode field effect transistors coupled between the other one of said sense lines and said voltage source, each of said enhancement mode field effect transistors having a source terminal connected to one of said sense lines, a gate terminal connected to said voltage source, and a drain terminal connected to an intermediate node, each of said depletion mode field effect transistors having a drain terminal connected to said voltage source, a source terminal connected to its corresponding intermediate node, and a gate terminal connected to one of said sense line or said corresponding intermediate node, whereby said predetermined voltage is substantially equal to the voltage of said voltage source minus the threshold voltage of said enhancement mode field effect transistor.

2. A memory circuit as recited in claim 1 wherein the gate terminal of each of said depletion mode field effect transistors is connected to its corresponding intermediate node.

3. A memory circuit as recited in claim 1 wherein the gate terminal of each of said depletion mode field effect transistors is connected to its corresponding sense line.

* * * * *